United States Patent [19]

Glenn

[11] Patent Number: 4,477,783

[45] Date of Patent: Oct. 16, 1984

[54] TRANSDUCER DEVICE

[75] Inventor: William E. Glenn, Ft. Lauderdale, Fla.

[73] Assignee: New York Institute of Technology, Old Westbury, N.Y.

[21] Appl. No.: 409,429

[22] Filed: Aug. 19, 1982

[51] Int. Cl.[3] ........................ H03H 7/34; H03H 9/13; H03H 9/15

[52] U.S. Cl. .................................... 333/138; 310/325; 310/334; 310/335; 333/147; 333/149; 367/155

[58] Field of Search ................................ 333/138–146, 333/147–149; 310/314–325, 357–359, 334–338; 367/7–9, 155, 156, 157, 158, 161, 162, 165, 180, 160, 164, 159, 163

[56] References Cited

U.S. PATENT DOCUMENTS

| | | | |
|---|---|---|---|
| 2,711,515 | 6/1955 | Mason | 333/145 |
| 2,787,777 | 4/1957 | Camp | 367/157 X |
| 2,806,155 | 9/1957 | Rotkin | 333/149 X |
| 3,296,585 | 1/1967 | Trott | 367/155 X |
| 3,321,738 | 5/1967 | Trott | 367/155 X |
| 3,381,246 | 4/1968 | Perry | 333/141 |

OTHER PUBLICATIONS

De Reggi et al., "Piezoelectric Polymer Probe for Ultrasonic Applications", J. Acoustic Soc. Am. 69(3) Mar. 1981; pp. 853–859.

*Primary Examiner*—Marvin L. Nussbaum

*Attorney, Agent, or Firm*—Martin Novack

[57] ABSTRACT

The disclosure is directed to an ultrasonic transducer device that includes a plurality of layers of piezoelectric material. A plurality of conductive electrodes are disposed on the layers of piezoelectric material such that each layer of piezoelectric material has electrodes on opposing surfaces thereof. A series string of electronic delay means is provided, and has successive stages that are respectively coupled between pairs of the electrodes. An input/output terminal is coupled to an end of the series string of electronic delay means. The time delay of each electronic delay means is selected as a function of the ultrasonic wave propagation time through the piezoelectric material across which the electronic delay means is coupled. Preferably, the time delay of each electronic delay means is substantially equal to the ultrasonic wave propagation time through the piezoelectric material across which the electronic delay means is coupled. In one embodiment, a plurality of layers of insulating material are respectively disposed between the electrode layers of adjacent layers of piezoelectric material. The layers of piezoelectric material have an inherent polarization and, in this embodiment, the polarization of each layer is in the same direction. In another embodiment, a single electrode is "shared" at the interface between adjacent layers of piezoelectric material. In this embodiment, the polarization direction alternates in successive layers.

4 Claims, 3 Drawing Figures

TRANSDUCER DEVICE

BACKGROUND OF THE INVENTION

This invention relates to piezoelectric transducer devices for converting electrical energy to ultrasonic energy, or vice versa.

Piezoelectric transducers are in widespread use for generating ultrasonic energy from electrical signals, and/or for converting ultrasonic energy back into electrical form. Application of a voltage across surfaces of a piezoelectric material produces mechanical distortion of the material which, in turn, launches wave energy such as ultrasound. Conversely, the application of ultrasound to such materials produces an electrical polarization.

Ultrasonic energy is utilized in systems for imaging the internal structure of the human body, inspecting equipment and parts, and many other uses. Ultrasonic energy tends to be reflected at interfaces at which the acoustic impedance of a transmission medium changes from one value to another. It is therefore desirable to have similarity of acoustic impedance of a transducer, the medium through which ultrasound is to travel to or from a body to be examined, and the body itself. This results in a more efficient communication of energy to and/or from the body, and the minimization of unnecessary losses of energy that would be expected at severe discontinuities of the acoustic impedance.

Piezoelectric plastic, for example, polyvinyladine fluoride ("PVDF") has certain desirable properties for use as a piezoelectric transducer. For example, the material is less expensive and easier to use than certain crystalline or ceramic piezoelectric materials, and it has an acoustic impedance which is near that of water and which closely matches the acoustic impedance of plastic ultrasound focusing lenses. It is therefore suitable, in this regard, for use when transmitting to or from a body with a high water content, such as in medical imaging applications.

In general, however, piezoelectric plastics have a relatively low piezoelectric coupling coefficient, which is the measure of the material's efficiency of converting electrical energy to mechanical energy, or vice versa. This can tend to be a limiting factor on their usefulness from the standpoint of sensitivity or, at least, the bandwidth over which sensitivity is sufficient for a given application.

It is among the objects of the present invention to provide a piezoelectric transducer device which exhibits improved sensitivity and bandwidth performance.

SUMMARY OF THE INVENTION

The present invention is directed to an ultrasonic transducer device that includes a plurality of layers of piezoelectric material. A plurality of conductive electrodes are disposed on the layers of piezoelectric material such that each layer of piezoelectric material has electrodes on opposing surfaces thereof. A series string of electronic delay means is provided, and has successive stages that are respectively coupled between pairs of the electrodes. An input/output terminal is coupled to an end of the series string of electronic delay means. The time delay of each electronic delay means is selected as a function of the ultrasonic wave propagation time through the piezoelectric material across which the electronic delay means is coupled. Preferably, the time delay of each electronic delay means is substantially equal to the ultrasonic wave propagation time through the piezoelectric material across which the electronic delay means is coupled.

In one embodiment of the invention, a plurality of layers of insulating material are respectively disposed between the electrode layers of adjacent layers of piezoelectric material. The layers of piezoelectric material have an inherent polarization and, in this embodiment, the polarization of each layer is in the same direction. In another embodiment of the invention, a single electrode is "shared" at the interface between adjacent layers of piezoelectric material. In this embodiment, the polarization direction alternates in successive layers.

Further features and advantages of the invention will become more readily apparent from the following detailed description when taken in conjunction with the accompanying drawings.

DESCRIPTION OF THE PREFERRED EMBODIMENTS

Figure 1:
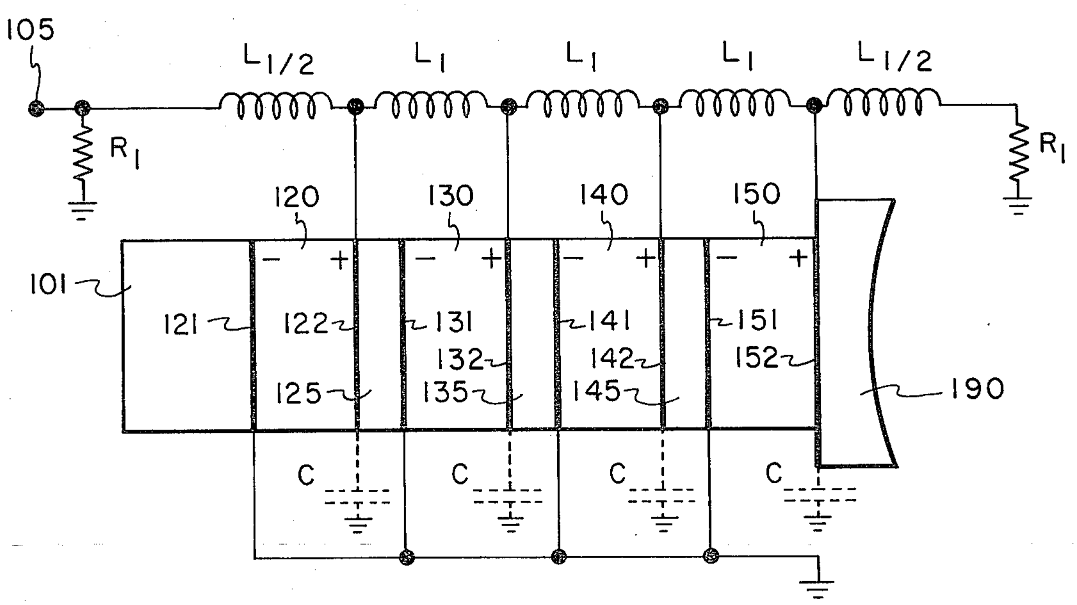
FIG. 1 is a cross-sectional view, partially in schematic form, of a transducer device in accordance with an embodiment of the invention.

In FIG. 1 there is shown a transducer apparatus in accordance with an embodiment of the present invention. A plurality of layers, 120, 130, 140 and 150, of piezoelectric material are provided. In the present embodiment, thin disc-shaped wafers are employed, although other shapes can be used. The wafers can be segmented, if desired. In the present embodiment the piezoelectric material is the polarized plastic, polyvinyladine fluoride ("PVDF"), that is manufactured, for example, by Pennwalt Corporation. Disposed on opposing sides of the layers 120, 130, 140 and 150, respectively, are electrodes 121, 122, 131, 132, 141, 142 and 151, 152. Insulating layers 125, 135 and 145 are disposed between the adjacent electrodes of the four piezoelectric layers. The electrodes may be formed of any suitable conductive material, such as silver or gold. The insulating material preferably has an acoustic impedance matched to the acoustic impedance of the piezoelectric layers. Mylar is employed in the present embodiment.

The electrodes 121, 131, 141 and 151 are coupled to ground reference potential. The electrodes 122, 132, 142 and 152 are coupled to a series string of electronic delay elements which comprise inductor elements $L_1$ in the present embodiment. The capacitive components C of the delay elements, as represented by the capacitive connections in dashed line in the FIGURE, are given rise to by the inherent capacitance of the piezoelectric layers. The terminals 122 and 152 are also coupled to ground reference potential via inductor elements of value $L_1/2$ and terminating impedances $R_1$. In the present embodiment, an input/output terminal 105 is provided between the resistor $R_1$ and the inductor $L_1/2$ that is coupled to electrode 122. A focusing lens 190 is illustrated as being coupled to the input (or output)

surface of the transducer device. A lossy plastic layer 101 is employed as a backing layer.

In the embodiment of FIG. 1, the individual piezoelectric layers 120, 130, 140 and 150, with their respective electrodes, are electrically isolated due to the presence of insulating layers 125, 135 and 145. The PVDF piezoelectric material of each layer has an inherent polarization. In the present embodiment, as shown, the polarization of each layer is in the same direction. The electrical delay between piezoelectric layers is selected to be substantially equal to the ultrasonic wave travel time of the ultrasound energy travelling through the piezoelectric layer across which the delay element is coupled.

In operation, when the transducer device is used in a transmit mode, terminal 105 is an input terminal to which the energizing signal is applied. As the ultrasound wave propagates toward the output surface (i.e., from left to right in the FIGURE), the electrical delays cause an electrical energizing signal to be applied to each layer in a manner such that the piezoelectric effect tends to reinforce the ultrasound wave at each layer. In particular, the ultrasonic energy developed in each piezoelectric layer is substantially in phase with the ultrasonic wave travelling toward the output surface from previously energized piezoelectric layers of the device.

When operating in a "receive" mode, ultrasonic energy is received via optional lens 190. This initially causes an electrical signal across the electrodes of the rightmost piezoelectric layer 150 due to the piezoelectric effect. The electrical signal then travels along the series string of electrical delay elements at substantially the same rate that the ultrasound wave travels in the stack of piezoelectric layers from right to left in the FIGURE. Accordingly, the electrical signals tend to accumulate substantially in phase. In this manner, the sensitivity and effective bandwidth of the received and/or transmitted signal is enhanced. The thickness of each section should preferably be no more than about one-half the wavelength of the highest frequency used.

Figure 2:
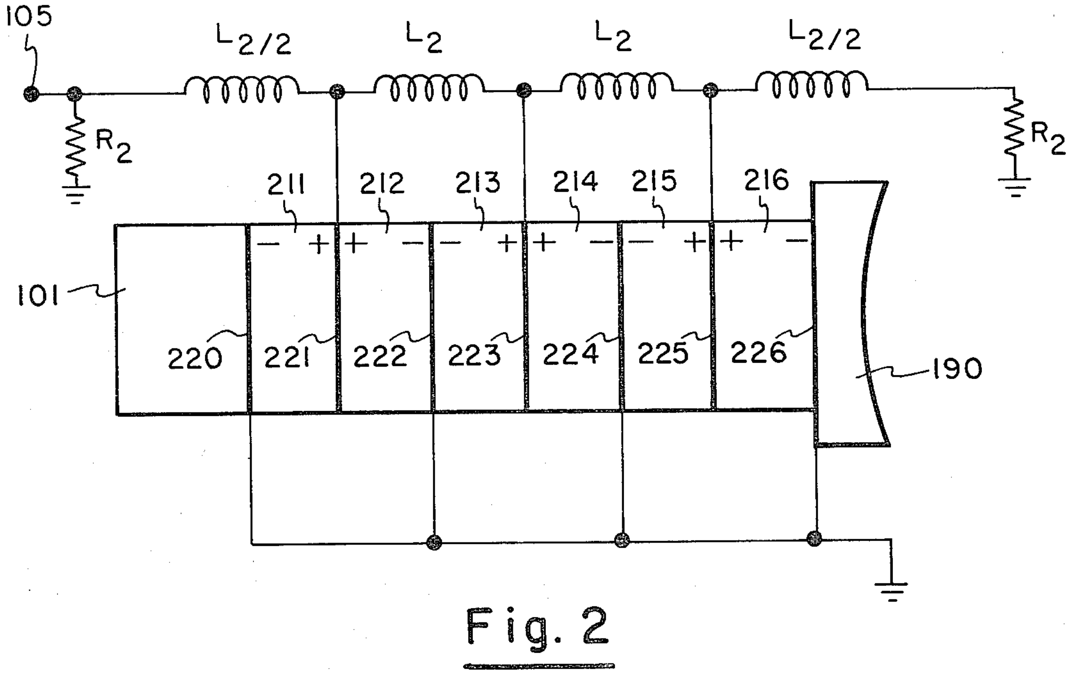
FIG. 2 is a cross-sectional view, partially in schematic form, of a transducer device in accordance with another embodiment of the invention.

FIG. 2 illustrates another embodiment of the invention wherein a single electrode at the interface between adjacent piezoelectric layers is "shared", and the isolation of insulating regions is not required. In the embodiment of FIG. 2, six piezoelectric layers, 211–216, are employed. End electrodes 220 and 226 are provided at the opposing ends of the stack of piezoelectric layers. Also, electrode 221 is provided at the interface between piezoelectric layers 211 and 212, and the electrodes 223, 224, and 225 are respectively provided at the other interfaces between adjacent piezoelectric layers, as illustrated in FIG. 2. The electrodes 220, 222, 224 and 226 are coupled to ground reference potential. The electrodes 221, 223 and 225 are coupled to a series string of electronic delay elements which comprise inductor elements $L_2$ in this embodiment (in conjunction with the inherent capacitance of the piezoelectric layers, not shown). The terminals 221 and 225 are also coupled to ground reference potential via inductor elements of value $L_2/2$ and terminating impedances $R_2$. An input/output terminal 105, backing layer 101, and focusing lens 190 are provided, as in FIG. 1. In the FIG. 2 embodiment, the inherent polarization of the piezoelectric layers is seen to alternate in successive layers. The electrical delay across a pair of layers is selected to be substantially equal to the ultrasonic wave travel time of the ultrasound energy travelling through the layer pair. The principle of operation is accordingly similar to that described in conjunction with FIG. 1.

Figure 3:
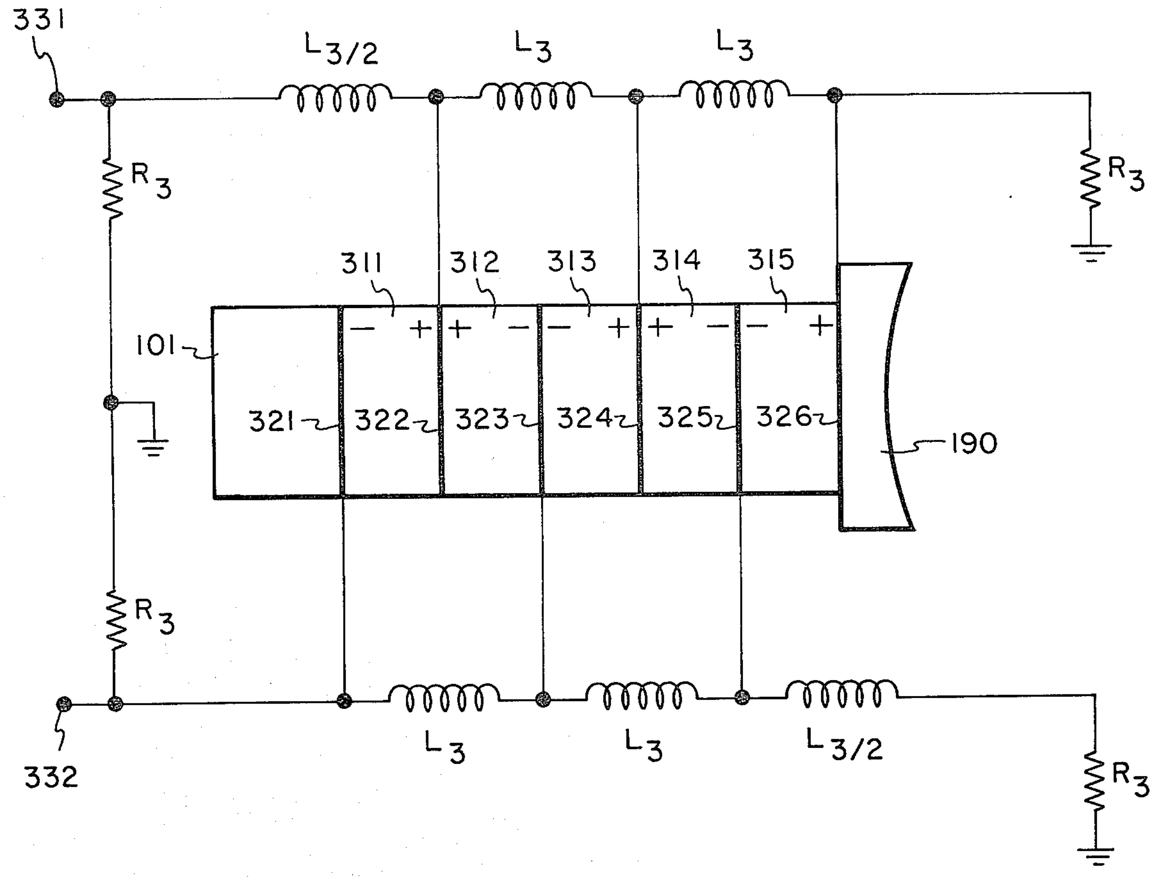
FIG. 3 is a cross-sectional view, partially in schematic form, of a transducer device in accordance with another embodiment of the invention.

Referring to FIG. 3, there is shown an embodiment that is a "balanced" version of the FIG. 2 embodiment. In particular, five piezoelectric layers 311 through 315 and six electrodes 321 through 326 are provided. The electrodes 321, 323 and 325 are coupled to a series string of inductor elements $L_3$, and the electrodes 322, 324 and 326 are coupled across another series string of inductor elements $L_3$. The electrodes 322 and 325 are also coupled through inductor elements of values $L_3/2$ and through terminating resistors $R_3$ to ground reference potential. Electrodes 321 and 326 are also coupled through terminating resistors $R_3$ to ground reference potential. A balanced input/output can then be applied and/or received across the terminals 331, 332 as illustrated in the FIGURE.

The invention has been described with reference to particular embodiments, but variations within the spirit and scope of the invention will occur to those skilled in the art. For example, it will be understood that operation can be implemented with or without the use of a focusing lens or backing layer. Also, alternative means of achieving the electronic delays can be employed. Further, it can be noted that the individual layers of piezoelectric material can be provided with different thicknesses, with the appropriate electrical delays being matched to the propagation time through the layers (or vice versa), if desired. Also, it will be understood that the principles of the invention apply to transmission and/or reception of ultrasonic energy, or any combination thereof, including transmission with one or more layers and reception with one or more different or identical layers. Finally, it is noted that appropriate amplifiers can be inserted in the disclosed circuits, before or after connection to delay elements.

I claim:

1. An ultrasonic transducer device, comprising:

a plurality of adjacent layers of polarized piezoelectric material, each layer having a polarization direction which is opposite to the polarization direction of the adjacent layer;

conductive electrodes disposed on said layers of piezoelectric material such that each layer of piezoelectric material has electrodes on opposing surfaces thereof, with electrodes being shared between adjacent layers;

a series string of delay means, each including inductive elements alternating with connecting terminals;

every other electrode being coupled to respective connecting terminals of said series string of delay means, and the remaining electrodes being coupled to a common terminal;

an input/output terminal coupled to an end of said series string of delay means, an input or output signal being applied or received between said input/output terminal and said common terminal;

the time delay of each delay means being substantially equal to the ultrasonic wave propagation time through the piezoelectric material across which the delay means is coupled.

2. The transducer device as defined by claim 1, wherein said polarized piezoelectric material is a polarized plastic.

3. An ultrasonic transducer device, comprising:

a plurality of adjacent layers of polarized piezoelectric material, each layer having a polarization direction which is opposite to the polarization direction of the adjacent layer;

conductive electrodes disposed on said layers of piezoelectric material such that each layer of piezoelectric material has electrodes on opposing surfaces thereof;

first and second series string of delay means, each including inductive elements alternating with connecting terminals;

every other electrode being coupled to respective connecting terminals of said first series string of delay means, and the remaining electrodes being coupled to respective connecting terminals of said second series string of delay means;

input/output terminals coupled to respective ends of said series strings of delay means;

the time delay of each delay means being substantially equal to the ultrasonic wave propagation time through the piezoelectric material across which the delay means is coupled.

4. The transducer device as defined by claim 3, wherein said polarized piezoelectric material is a polarized plastic.

* * * * *